(12) United States Patent
Jimenez et al.

(10) Patent No.: US 9,401,351 B2
(45) Date of Patent: Jul. 26, 2016

(54) ELECTRONIC DEVICE FOR ESD PROTECTION

(71) Applicant: STMicroelectronics S.A., Montrouge (FR)

(72) Inventors: Jean Jimenez, Saint Theoffrey (FR); Boris Heitz, Grenoble (FR); Johan Bourgeat, Saint Pierre d'allev (FR); Agustin Monroy Aguirre, St Martin d'Heres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/610,173

(22) Filed: Jan. 30, 2015

(65) Prior Publication Data

US 2015/0214214 A1 Jul. 30, 2015

(30) Foreign Application Priority Data

Jan. 30, 2014 (FR) ..................................... 14 50724

(51) Int. Cl.
| H01L 27/00 | (2006.01) |
| H01L 27/02 | (2006.01) |
| H01L 27/12 | (2006.01) |
| H01L 27/102 | (2006.01) |
| H01L 29/74 | (2006.01) |
| H01L 29/87 | (2006.01) |

(52) U.S. Cl.
CPC ........ *H01L 27/0262* (2013.01); *H01L 27/1027* (2013.01); *H01L 27/1203* (2013.01); *H01L 29/7436* (2013.01); *H01L 29/87* (2013.01); *H01L 2924/1301* (2013.01)

(58) Field of Classification Search
CPC ................... H01L 2924/1301; H01L 29/7436; H01L 27/1027
See application file for complete search history.

(56) References Cited

U.S. PATENT DOCUMENTS

| 7,910,950 | B1 | 3/2011 | Vashchenko et al. | |
| 2003/0214773 | A1* | 11/2003 | Kitagawa | H01L 27/0251 361/118 |
| 2006/0244071 | A1 | 11/2006 | Kondo | |
| 2007/0262386 | A1* | 11/2007 | Gossner | H01L 27/0262 257/355 |
| 2008/0088993 | A1 | 4/2008 | Entringer et al. | |
| 2010/0328826 | A1* | 12/2010 | Salman | H01L 21/84 361/56 |
| 2012/0319204 | A1 | 12/2012 | Benoist et al. | |
| 2013/0113017 | A1* | 5/2013 | Galy | H01L 27/0262 257/124 |
| 2014/0211346 | A1* | 7/2014 | Gendron | H01L 27/0262 361/56 |

FOREIGN PATENT DOCUMENTS

WO 2011089179 A1 7/2011

\* cited by examiner

*Primary Examiner* — Ngan Ngo
(74) *Attorney, Agent, or Firm* — Slater Matsil, LLP

(57) ABSTRACT

An electronic device includes a thyristor having an anode, a cathode, a first bipolar transistor disposed on the anode side. A second bipolar transistor is disposed on the cathode side. These two bipolar transistors are nested and connected between the anode and the cathode. A MOS transistor is coupled between the collector region and the emitter region of the second bipolar transistor. The transistor has a gate region connected to the cathode via a resistive semiconductor region incorporating at least a part of the base region of the second bipolar transistor.

20 Claims, 5 Drawing Sheets

ELECTRONIC DEVICE FOR ESD PROTECTION

This application claims the benefit of French Application No. 1450724, filed on Jan. 30, 2014, which application is hereby incorporated herein by reference.

TECHNICAL FIELD

The invention relates to electronic devices, and notably those designed for the protection of components against electrostatic discharges (or ESD).

BACKGROUND

Generally speaking, the devices for protection against electrostatic discharges comprise a large number of diodes in series, for example, on the order of twenty for an electronic system to be protected operating at 15 volts.

In order to reduce the number of components, the U.S. Patent Application Pub. No. 2008/0088993 A1 provides a gated thyristor designed notably for the protection against electrostatic discharges. However, in certain cases, such a gated thyristor exhibits a significant instability and requires several triggering circuits in order to trigger the thyristor in the presence of an ESD pulse. The number of components for providing an ESD protection is reduced because such a thyristor needs two triggering circuits which, for a reversible protection, leads to six components (two thyristors and four triggering circuits). However, the need for the presence of such a triggering system still leads to constraints on the surface occupation of such a protection circuit and may, in certain cases, turn out to be complex to implement.

SUMMARY

According to one embodiment, an electronic device is provided based on a gated thyristor which occupies less surface area, has an enhanced stability, and is self-triggering, in other words not requiring a specific triggering circuit to trigger it, notably in the presence of an ESD pulse.

According to one aspect, an electronic device is provided, comprising a thyristor having an anode, a cathode, a first bipolar transistor situated on the anode side, a second bipolar transistor situated on the cathode side, these two bipolar transistors being nested and connected between the anode and the cathode, an MOS transistor coupled between the collector region and the emitter region of the second bipolar transistor having a gate region connected to the cathode via a resistive semiconductor region incorporating at least a part of the base region of the second bipolar transistor.

This base region of the second bipolar transistor, which is situated on the cathode side and which is also the substrate region of the MOS transistor, offers an intrinsic resistance which, with the reverse capacitive NP junction between the base regions of the two bipolar transistors, allows the thyristor to be triggered when an ESD pulse occurs propagating from the anode towards the cathode, while at the same time ensuring its stability when it is connected to the terminals of a component in normal operation. Indeed, this base region, which is also the substrate region of the MOS transistor, is not floating but connected to the cathode.

Thus, the resistive-capacitive network allowing the thyristor to be triggered here is a network internal to the thyristor itself since it comprises a resistive path of the base region of the bipolar transistor situated on the cathode side and the capacitance of the reverse NP junction between the two base regions of the two bipolar transistors.

Although such a device may be fabricated in any technology, notably a bulk silicon technology, it is especially applicable to a technology of the silicon-on-insulator (or SOI) type.

Thus, according to one embodiment, the device is fabricated in a technology of the silicon-on-insulator type and comprises, within a semiconductor film situated on top of an insulating layer (commonly denoted by those skilled in the art under the acronym BOX: "Buried OXide") itself situated on top of a carrier substrate.

A first semiconductor region has a first type of conductivity, for example the N type of conductivity, and includes the base region of the first bipolar transistor (situated on the anode side) together with the collector region of the second bipolar transistor. A second semiconductor region has a second type of conductivity, for example the P type of conductivity, incorporating the resistive semiconductor region, the base region of the second bipolar transistor (situated on the cathode side) and the collector region of the first bipolar transistor (situated on the anode side). A third semiconductor region has the second type of conductivity and includes the anode and the emitter region of the first bipolar transistor. A fourth semiconductor region has the first type of conductivity and includes the cathode and the emitter region of the second bipolar transistor.

The gate region extends at least over the top of the base region and preferably also over the top of the emitter and collector region of the second bipolar transistor. A first metallization connects the gate region to a first location of the second semiconductor region and a second metallization connects a second location of the second semiconductor region to the fourth semiconductor region, the part of the second semiconductor region situated between the two locations forming the resistive semiconductor region.

According to another aspect, a circuit for protection against electrostatic discharges includes a first terminal, a second terminal and at least one electronic device such as defined hereinbefore having its anode connected to the first terminal and its cathode connected to the second terminal.

In such a manner as to provide a bidirectionality of the protection, the protection circuit comprises, according to one embodiment, at least one other electronic device such as defined hereinbefore having its anode connected to the second terminal and its cathode connected to the first terminal.

According to another aspect, an input/output cell of an integrated circuit is provided, comprising an input/output lug, a first power supply terminal, designed for example to receive the power supply voltage Vdd, a second power supply terminal, designed for example to be connected to ground, a first protection circuit such as defined hereinbefore coupled between the first power supply terminal and the input/output lug, a second protection circuit such as defined hereinbefore coupled between the input/output lug and the second power supply terminal, and a third protection circuit such as defined hereinbefore coupled between the first power supply terminal and the second power supply terminal.

According to another aspect, an integrated circuit is provided comprising at least an input/output cell such as defined hereinbefore.

According to yet another aspect, a method is provided for adjusting the trigger voltage of an electronic device such as defined hereinbefore, comprising an adjustment of the length of the resistive semiconductor region.

BRIEF DESCRIPTION OF THE DRAWINGS

Other advantages and features of the invention will become apparent upon examining the detailed description of non-limiting embodiments and their implementation, and of the appended drawings in which.

DETAILED DESCRIPTION OF ILLUSTRATIVE EMBODIMENTS

Figure 1:
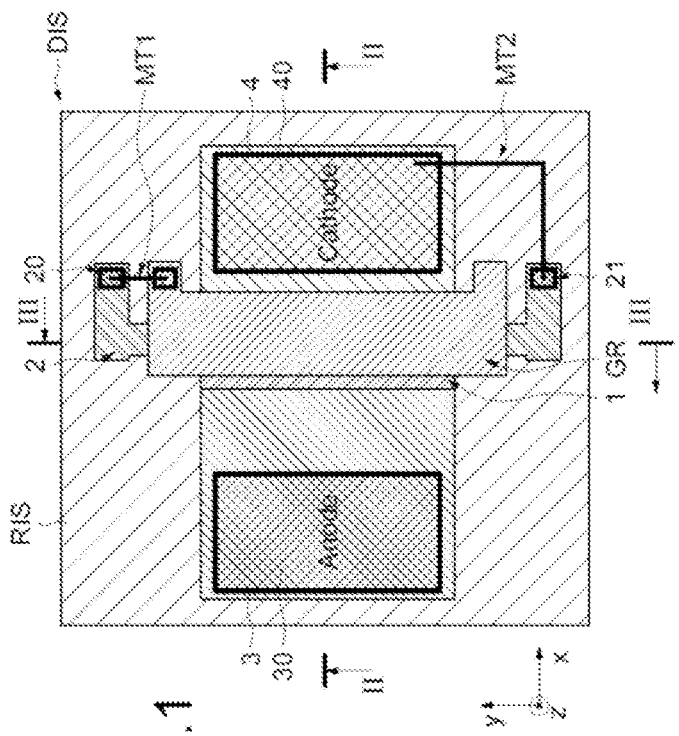
FIGS. 1 to 10 relate to various embodiments of the invention and their implementation.
Figure 2:
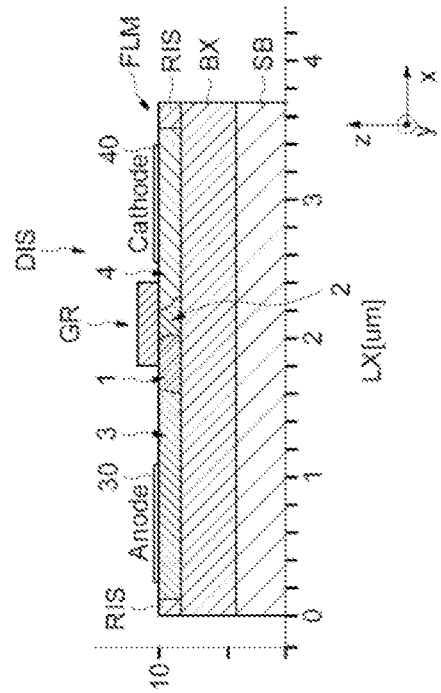
Figure 3:
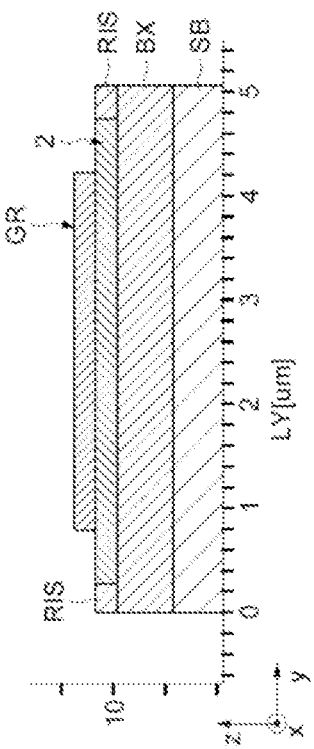

In FIGS. 1, 2 and 3, the reference DIS denotes an electronic device fabricated using a technology of the silicon-on-insulator (SOI) type. For example, the invention is fully functional on partially depleted SOI (PDSOI) bulk.

FIG. 2 is a cross-sectional view along the line II-II in FIG. 1, whereas FIG. 3 is a cross-sectional view along the line III-III in FIG. 1.

In such a technology, and as illustrated in these figures, the device DIS is fabricated within a semiconductor film FLM, having for example the P type of conductivity, supported by a layer of buried oxide BX, commonly denoted by those skilled in the art using the acronym BOX, itself supported by a semiconductor carrier substrate SB, for example also of the P type.

As illustrated in these figures, the device DIS is bounded by an insulating region RIS, for example of the shallow trench isolation (or STI) type.

The device DIS comprises, within this semiconductor film FLM for example made of silicon, a first semiconductor region 1 having a first type of conductivity, for example the N type of conductivity. A second semiconductor region 2 has a second type of conductivity opposite to the first, for example the P type of conductivity. A third semiconductor region 3 has the second type of conductivity, here the P type of conductivity. This third semiconductor region is doped P+, in other words it is more highly doped than the second P-doped semiconductor region 2.

As will be seen hereinafter, this third semiconductor region 3 notably forms the anode of a thyristor and, for this purpose, comprises an area 30 comprising a metal silicide and forming an anode contact.

The device DIS furthermore comprises a fourth semiconductor region 4 having the first type of conductivity, in this case the N type of conductivity, which notably forms a cathode for the thyristor. This fourth semiconductor region is more highly doped (doped N+) than the first semiconductor region 1 doped N. This region 4 also comprises an area 40 comprising a metal silicide and forming a cathode contact.

The device DIS also comprises an isolated gate region GR, which can be a semiconductor gate or, as a variant, a metal gate. As illustrated in FIG. 2, this gate region GR here covers, for example by means of a gate oxide, the semiconductor region 2 but also a part of the semiconductor regions 1 and 4. Indeed, as will be seen in more detail hereinafter, this gate GR is the gate of an MOS transistor and the fact that this gate GR covers a part of the semiconductor regions 1 and 4 allows any channel discontinuity in the semiconductor region 2 to be avoided.

Furthermore, as can be seen in FIG. 1, the semiconductor region 2 goes beyond the edge in the direction of the length, in other words in the direction of the y axis, of the gate region GR.

This overlap readily allows the formation of an electrical link between a first location 20 of this second semiconductor region 2 and the gate region GR. Here, this electrical link is formed by a metallization MT1 which can be formed for example at the first metallization level of the integrated circuit incorporating the device DIS.

This device furthermore comprises a second electrical link, also for example formed by a metallization MT2, between a second location 21 of the second semiconductor region 2 and the fourth semiconductor region 4.

The part of the second semiconductor region 2 situated between the two locations 20 and 21 forms a resistive semiconductor region having a resistance R2.

The device DIS is here fabricated using a 0.13 micron technology and its width LX, measured along the x axis, is around 3 microns, whereas its length LY, measured along the y axis, is slightly less than 5 microns.

Figure 4:
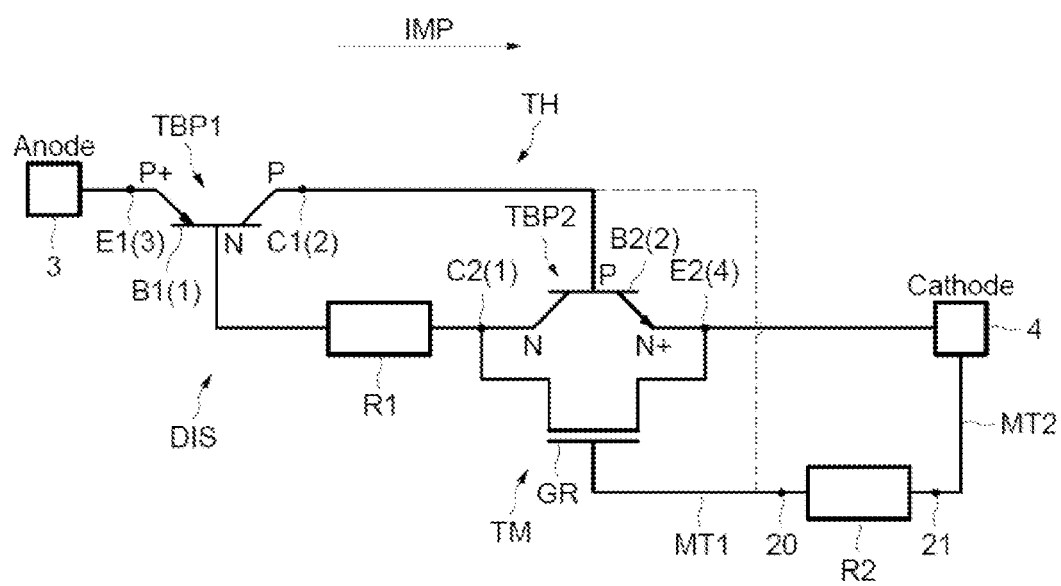

As illustrated in FIG. 4, which shows an equivalent electrical circuit diagram of the device DIS in FIGS. 1, 2 and 3, it can be seen that the device DIS comprises a thyristor TH having an anode, a cathode, a first bipolar transistor PNP referenced TBP1 situated on the anode side, a second bipolar transistor NPN referenced TBP2 situated on the cathode side.

These two transistors are nested and connected between the anode and the cathode. More precisely, the collector C1 of the first bipolar transistor TBP1 is connected to the base B2 of the second bipolar transistor TBP2 and the collector C2 of the second of the bipolar transistor TBP2 is connected to the base B1 of the first bipolar transistor TBP1.

The emitter E1 of the first bipolar transistor TBP1 is connected to (and forms) the anode 3 of the thyristor.

The emitter E2 of the second bipolar transistor TBP2 is connected to (and forms) the cathode 4 of the thyristor.

Furthermore, an MOS transistor TM is coupled between the collector C2 and the emitter E2 of the second bipolar transistor TBP2. The gate region GR of the MOS transistor TM is connected to the cathode via the metallization MT1, the resistor R2, the second resistive semiconductor region and the metallization MT2.

The dashed line between the base B2 of the transistor TBP2 and the location 20 of the semiconductor region 1 represents schematically the fact that the base region B2 is not floating but is connected to the cathode by means of a portion of the region 1.

The first semiconductor region 1 incorporates the base region B1 of the first bipolar transistor TBP1, together with the collector region C2 of the second bipolar transistor TBP2.

The resistor R1 represents the resistance of this first semiconductor region.

The second semiconductor region 2 incorporates the resistive semiconductor region situated between the locations 20 and 21, together with the base region B2 of the second bipolar transistor TBP2 and the collector region C1 of the first bipolar transistor TBP1.

The third semiconductor region 3 incorporates the anode and the emitter region E1 of the first bipolar transistor TBP1 and the fourth semiconductor region 4 incorporates the cathode and the emitter region E2 of the second bipolar transistor TBP2.

It can be seen that the device DIS comprises the gated thyristor TH comprising the two nested bipolar transistors TBP1 and TBP2 together with the MOS transistor TM. The MOS transistor is able to inject a current into the base B2 of the transistor TBP2 (here an NPN transistor) and hence of improving the triggering of the thyristor.

When an ESD pulse IMP propagates from the anode towards the cathode, the voltage on the gate GR of the MOS transistor will increase thanks to the resistance R2 of the resistive semiconductor region and to the injection of current via the reverse capacitive NP junction between the first semiconductor region 1 and the second semiconductor region 2. At a certain moment, the device goes into lock (the thyristor triggers) and then goes into high injection mode.

The thyristor is then self-sustaining. The current flowing through the thyristor then needs to be cancelled in order to recover the initial non-triggered state.

Figure 5:
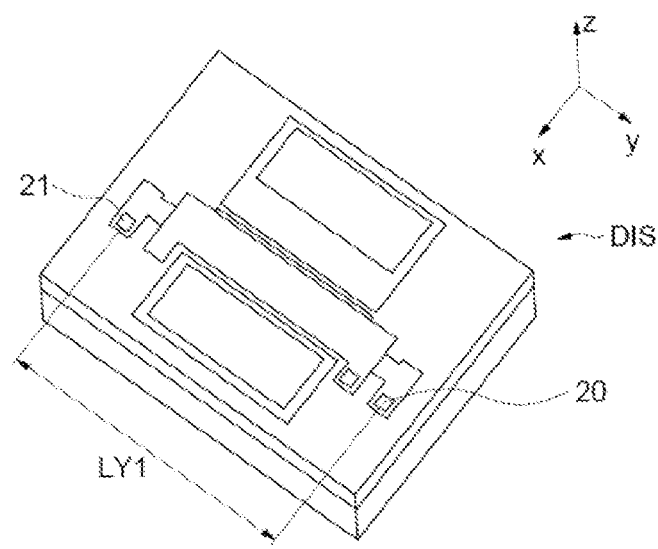

The value of the resistance R2 of the resistive semiconductor region situated between the locations 20 and 21 allows the trigger voltage of the thyristor to be adjusted. Thus, as illustrated in FIG. 5, for a length LY1 equal to 2.5 microns, a trigger voltage of around 4.6 volts is obtained.

Figure 6:
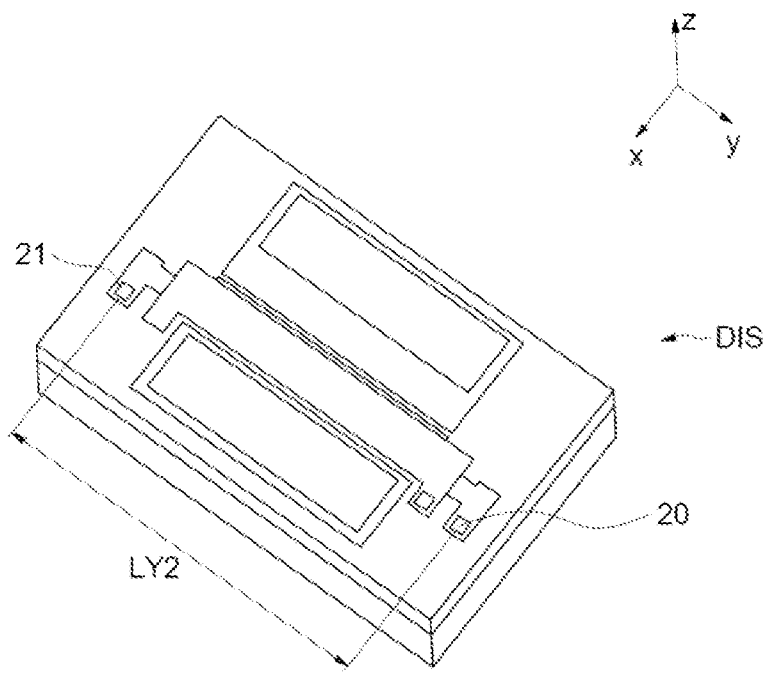

On the other hand, if the length of the device is increased, in other words for a length LY2 greater than LY1, the trigger voltage is decreased. Thus, as illustrated in FIG. 6, for a length LY2 equal to 5 microns, a trigger voltage of around 4.2 volts is obtained.

Figure 7:
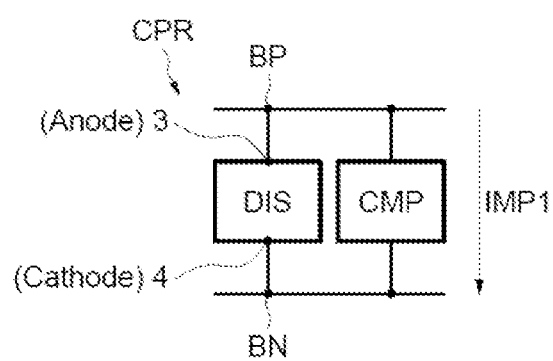

As illustrated in FIG. 7, the device DIS can be used as a circuit CPR for protecting an electronic component CMP against electrostatic discharges. The component CMP is connected to a first terminal BP and to a second terminal BN of the protection circuit. The electronic component may be a single component or else any electronic system to be protected.

By way of example, when the component CMP is in operation, the terminal BP can be connected to a voltage Vp positive and the terminal BN can be connected to a negative voltage Vn or equal to zero (ground). The fact that the base B2 of the bipolar transistor TBP2 (substrate of the MOS transistor TM) is not floating (since connected to the cathode) improves the stability of the device DIS, in other words reduces the risk of a spurious triggering when the component is in operation.

When the component CMP is not in operation, it may be subjected to an electrostatic discharge typically resulting in a very short current pulse (typically a few microseconds) whose current peak is for example of the order of 2 amps and which occurs typically after 10 nanoseconds. Typically, this corresponds for example to a pulsed potential difference applied between the terminals BP and BN through an R-L-C equivalent circuit, whose peak voltage occurs after 10 nanoseconds with an intensity of 1 to 4 kVolts HBM, for example 4 kVolts HBM for 2.5 amps.

It is recalled here that the letters HBM stand for "Human Body Model" well known to those skilled in the art in the field of the protection against electrostatic discharges and notably denote an electrical circuit aimed at modelling an electrostatic discharge delivered by a human being and normally used for testing the sensitivity of devices to electrostatic discharges. This HBM electrical circuit, which is the R-L-C equivalent circuit mentioned hereinbefore and to which a high voltage is applied, notably comprises a capacitor of 100 pF which discharges through a resistance of 1.5 kilo-ohms in the device to be tested. Thus, in the present case, an electrostatic discharge of 4 kilovolts HBM means that a potential difference of 4 kilovolts is applied to the HBM electrical circuit.

This current pulse should then flow through the device DIS and not through the component CMP to be protected.

The device DIS accordingly aims to absorb this current pulse and to avoid over-voltages at the terminals of the component CMP.

For this purpose, the anode 3 of the device DIS is connected to the first terminal BP, whereas the cathode 4 of the device is connected to the second terminal BN.

The component CMP is then protected against ESD pulses IMP propagating from the terminal BP towards the terminal BN.

Figure 8:
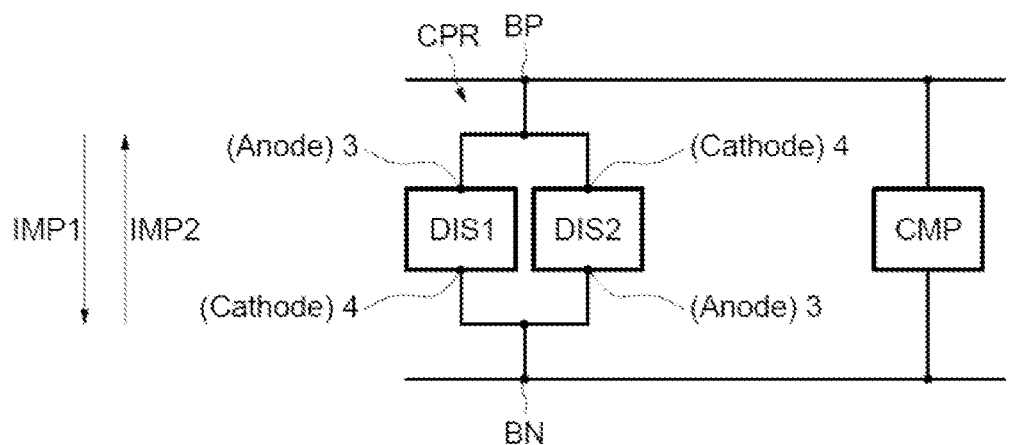

In order to allow a bidirectional protection, it is for example provided, as illustrated in FIG. 8, for the protection circuit CPR to comprise a first device DIS1 with a structure analogous to the device DIS that has just been described, whose anode is connected to the terminal BP and whose cathode is connected to the terminal BN, together with a second device DIS2 with a structure analogous to the first device DIS1, but whose anode is this time connected to the terminal BN and whose cathode is this time connected to the terminal BP. The component CMP can then be protected against the ESD pulses IMP1 propagating from the terminal BP towards the terminal BN and also against ESD pulses IMP2 propagating from the terminal BN towards the terminal BP.

It is particularly advantageous to incorporate devices for protection against electrostatic discharges of the type of those which have just been described into an input-output cell of an integrated circuit.

Figure 9:
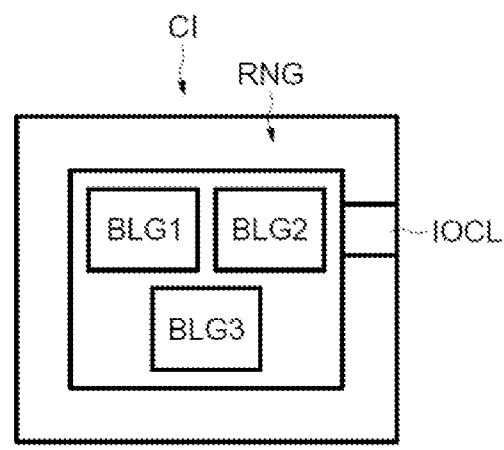

By way of non-limiting example, such input/output cells IOCL may be disposed, as illustrated in FIG. 9, within a ring RNG on the periphery of the integrated circuit CI.

These cells IOCL can for example transport power supply voltages and/or data signals destined for and/or coming from functional blocks BLG1-BLG3 of the integrated circuit.

Figure 10:
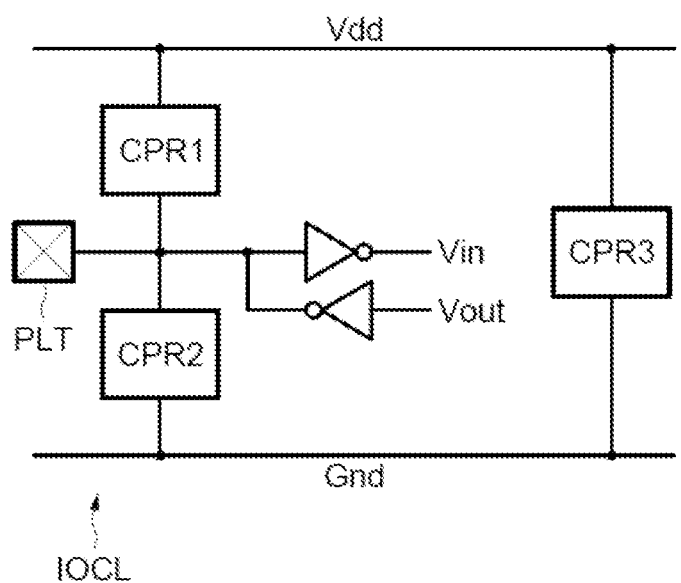

As illustrated in FIG. 10, the input-output cell comprises for example an input-output lug PLT for receiving/transmitting a signal. This cell comprises two supply terminals Vdd and Gnd. A first bidirectional protection circuit CPR1 of the type of that which has just been described hereinbefore is disposed between the power supply terminal Vdd and the input-output lug PLT.

A second bidirectional protection circuit CPR2 is disposed between the input-output lug PLT and the second power supply terminal Gnd. Finally, a third bidirectional protection circuit CPR3 is disposed between the two supply terminals Vdd and Gnd.

Thus, such an input-output cell is protected, in an extremely simple manner, against an electrostatic discharge occurring between the two supply terminals Vdd and Gnd, and also against an electrostatic discharge that may occur either between the power supply terminal Vdd and the input-output lug or between the input-output lug and the power supply terminal Gnd. The functional blocks connected between the two terminals Vdd and Gnd are therefore also protected against an electrostatic discharge.

What is claimed is:
1. An electronic device, comprising:
   a semiconductor-on-insulator substrate that includes a semiconductor film disposed over an insulating layer, the insulating layer being disposed over a carrier substrate;
   a thyristor disposed in the semiconductor film, the thyristor having an anode, a cathode, a first bipolar transistor located on an anode side, and a second bipolar transistor located on a cathode side, the first and second bipolar transistors being nested and connected between the anode and the cathode; and
   a MOS transistor disposed in the semiconductor film, the MOS transistor coupled between a collector region and an emitter region of the second bipolar transistor, the MOS transistor having a gate region connected to the cathode via a resistive semiconductor region that incorporates at least a part of a base region of the second bipolar transistor.
2. The electronic device according to claim 1, wherein the semiconductor film comprises:

a first semiconductor region having a first conductivity type and including a base region of the first bipolar transistor and also the collector region of the second bipolar transistor;

a second semiconductor region having a second conductivity type opposite to the first conductivity type, incorporating the resistive semiconductor region, the base region of the second bipolar transistor and the collector region of the first bipolar transistor, wherein the gate region extends at least over the base region of the second bipolar transistor;

a third semiconductor region having the second conductivity type and including the anode and the emitter region of the first bipolar transistor;

a fourth semiconductor region having the first conductivity type and including the cathode and the emitter region of the second bipolar transistor;

a first metallization electrically connecting the gate region to a first location of the second semiconductor region; and a second metallization electrically connecting a second location of the second semiconductor region to the fourth semiconductor region, the part of the second semiconductor region located between two locations forming the resistive semiconductor region.

3. The electronic device according to claim 2, wherein the first conductivity type is n-type and the second conductivity type is p-type.

4. The electronic device according to claim 2, wherein the second semiconductor region and the resistive semiconductor region extend beyond an edge of the gate region.

5. The electronic device according to claim 1, wherein a trigger voltage of the electronic device according is determined by the resistive semiconductor region.

6. A circuit for protection against electrostatic discharges, the circuit comprising:
    a first terminal;
    a second terminal; and
    the electronic device according to claim 1, wherein the anode is coupled to the first terminal and the cathode is coupled to the second terminal.

7. A circuit for protection against electrostatic discharges that includes first and second electronic devices each being configured according to claim 1, the circuit comprising:
    a first terminal;
    a second terminal;
    the first electronic device, wherein the anode of the first electronic device is coupled to the first terminal and the cathode of the first electronic device is coupled to the second terminal; and
    the second electronic device, wherein the anode of the second electronic device is coupled to the first terminal and the cathode of the second electronic device is coupled to the first terminal.

8. An input/output cell of an integrated circuit, the input/output cell comprising:
    an input/output lug;
    a first power supply terminal;
    a second power supply terminal; and
    first, second and third circuits that are each configured according to claim 7, wherein the first circuit is coupled between the first power supply terminal and the input/output lug, the second circuit is coupled between the input/output lug and the second power supply terminal, and the third circuit is coupled between the first power supply terminal and the second power supply terminal.

9. An electronic device comprising:
integrated circuitry;
an input/output section coupled to the integrated circuitry;
a first power supply terminal coupled to the integrated circuitry;
a second power supply terminal coupled to the integrated circuitry;
a first electronic device coupled between the first power supply terminal and the input/output section, the first electronic device comprising:
    a first semiconductor-on-insulator (SOI) substrate that includes a semiconductor film disposed over an insulating layer, the insulating layer being disposed over a first carrier substrate,
    a first thyristor disposed in the semiconductor film of the first SOI substrate, the first thyristor having an anode, a cathode, a first bipolar transistor located on an anode side, and a second bipolar transistor located on a cathode side, the first and second bipolar transistors of the first thyristor being nested and connected between the anode and the cathode of the first thyristor, and
    a first MOS transistor disposed in the semiconductor film of the first SOI substrate, the first MOS transistor coupled between a collector region and an emitter region of the second bipolar transistor of the first thyristor, the first MOS transistor having a gate region connected to the cathode of the first thyristor via a resistive semiconductor region that incorporates at least a part of a base region of the second bipolar transistor of the first thyristor;
a second electronic device coupled between the input/output section and the second power supply terminal, the second electronic device comprising:
    a second SOI substrate that includes a semiconductor film disposed over an insulating layer, the insulating layer being disposed over a second carrier substrate,
    a second thyristor disposed in the semiconductor film of the second SOI substrate, the second thyristor having an anode, a cathode, a first bipolar transistor located on an anode side, and a second bipolar transistor located on a cathode side, the first and second bipolar transistors of the second thyristor being nested and connected between the anode and the cathode of the second thyristor, and
    a second MOS transistor disposed in the semiconductor film of the second SOI substrate, the second MOS transistor coupled between a collector region and an emitter region of the second bipolar transistor of the second thyristor, the second MOS transistor having a gate region connected to the cathode of the second thyristor via a resistive semiconductor region that incorporates at least a part of a base region of the second bipolar transistor of the second thyristor; and
a third electronic device coupled between the first power supply terminal and the second power supply terminal, the third electronic device comprising:
    a third SOI substrate that includes a semiconductor film disposed over an insulating layer, the insulating layer being disposed over a third carrier substrate,
    a third thyristor disposed in the semiconductor film of the third SOI substrate, the third thyristor having an anode, a cathode, a first bipolar transistor located on an anode side, and a second bipolar transistor located on a cathode side, the first and second bipolar transistors of the third thyristor being nested and connected between the anode and the cathode of the third thyristor, and a third MOS transistor disposed in the semiconductor film of the third SOI substrate, the third MOS transistor coupled between a collector region and an emitter region of the second bipolar transistor of the third thyristor, the third MOS transistor having a gate region connected to the cathode of the third thyristor via a resistive semiconductor region that incorporates at least a part of a base region of the second bipolar transistor of the third thyristor.

10. The electronic device according to claim 9, wherein
the first SOI substrate, the second SOI substrate, and the third SOI substrate together comprise a single SOI substrate, and
the integrated circuitry is disposed in the single SOI substrate.

11. An electronic device comprising:
a semiconductor-on-insulator (SOI) substrate that includes a semiconductor film formed over an insulating layer, the insulating layer being formed over a carrier substrate;
a thyristor formed on the SOI substrate and having an anode and a cathode, the thyristor comprising:
a first bipolar transistor, and
a second bipolar transistor, the first and second bipolar transistors being nested and connected between the anode and the cathode;
a MOS transistor formed on the SOI substrate and having a conduction path coupled in parallel with a primary conduction path of the second bipolar transistor, and a gate connected to the cathode through a resistive semiconductor region formed within the semiconductor film of the SOI substrate; and
wherein the MOS transistor is configured to trigger the thyristor during an electrostatic discharge (ESD) event at the anode or the cathode.

12. The electronic device of claim 11, wherein the resistive semiconductor region includes at least a part of a base region of the second bipolar transistor.

13. The electronic device according to claim 11, wherein a trigger voltage of the electronic device according is determined by the resistive semiconductor region.

14. The electronic device according to claim 11, wherein the semiconductor film comprises:
a first semiconductor region having a first conductivity type and including a base region of the first bipolar transistor and also a collector region of the second bipolar transistor;
a second semiconductor region having a second conductivity type opposite to the first conductivity type, incorporating the resistive semiconductor region, the base region of the second bipolar transistor and a collector region of the first bipolar transistor, wherein a gate region extends at least over the base region of the second bipolar transistor;
a third semiconductor region having the second conductivity type and including the anode and an emitter region of the first bipolar transistor;
a fourth semiconductor region having the first conductivity type and including the cathode and an emitter region of the second bipolar transistor;
a first metallization electrically connecting the gate region to a first location of the second semiconductor region; and
a second metallization electrically connecting a second location of the second semiconductor region to the fourth semiconductor region, the part of the second semiconductor region located between two locations forming the resistive semiconductor region.

15. The electronic device according to claim 14, wherein the second semiconductor region and the resistive semiconductor region extend beyond an edge of the gate region.

16. The circuit according to claim 6, wherein the semiconductor film comprises:
a first semiconductor region having a first conductivity type and including a base region of the first bipolar transistor and also the collector region of the second bipolar transistor;
a second semiconductor region having a second conductivity type opposite to the first conductivity type, incorporating the resistive semiconductor region, the base region of the second bipolar transistor and the collector region of the first bipolar transistor, wherein the gate region extends at least over the base region of the second bipolar transistor;
a third semiconductor region having the second conductivity type and including the anode and the emitter region of the first bipolar transistor;
a fourth semiconductor region having the first conductivity type and including the cathode and the emitter region of the second bipolar transistor;
a first metallization electrically connecting the gate region to a first location of the second semiconductor region; and
a second metallization electrically connecting a second location of the second semiconductor region to the fourth semiconductor region, the part of the second semiconductor region located between two locations forming the resistive semiconductor region.

17. The circuit according to claim 16, wherein the second semiconductor region and the resistive semiconductor region extend beyond an edge of the gate region.

18. The circuit according to claim 6, wherein a trigger voltage of the electronic device according is determined by the resistive semiconductor region.

19. The circuit according to claim 6, wherein the circuit is formed with a ring on a peripheral region of an integrated circuit that includes a plurality of functional blocks, the ring surrounding the functional blocks.

20. The circuit according to claim 8, wherein the circuit is formed with a ring on a peripheral region of an integrated circuit that includes a plurality of functional blocks, the ring surrounding the functional blocks and wherein the functional blocks receive power supply voltages and via the input/output lug, the first power supply terminal, and the second power supply terminal.

* * * * *